(12) United States Patent
Lee et al.

(10) Patent No.: US 6,975,010 B2
(45) Date of Patent: Dec. 13, 2005

(54) MEMS STRUCTURE HAVING A BLOCKED-SACRIFICIAL LAYER SUPPORT/ANCHOR AND A FABRICATION METHOD OF THE SAME

(75) Inventors: Eun-sung Lee, DaeJeon (KR); Moon-chul Lee, Sungnam (KR); Hyun-ok Kim, Yongin (KR)

(73) Assignee: Samsung Electronics Co., Ltd., Gyunggi-do (KR)

( * ) Notice: Subject to any disclaimer, the term of this patent is extended or adjusted under 35 U.S.C. 154(b) by 78 days.

(21) Appl. No.: 10/320,679

(22) Filed: Dec. 17, 2002

(65) Prior Publication Data

US 2003/0122205 A1    Jul. 3, 2003

(30) Foreign Application Priority Data

Dec. 18, 2001  (KR) ............................... 2001-80358

(51) Int. Cl.$^7$ ............................................. H01L 29/82
(52) U.S. Cl. ..................................... 257/419; 257/417
(58) Field of Search ........................... 257/419; 438/52

(56) References Cited

U.S. PATENT DOCUMENTS

| | | | |
|---|---|---|---|
| 5,756,901 A | 5/1998 | Kurle et al. | |
| 5,970,315 A | 10/1999 | Carley et al. | |
| 6,184,052 B1 * | 2/2001 | Vigna et al. | ................... 438/51 |

FOREIGN PATENT DOCUMENTS

EP          0890978 A1    1/1999

* cited by examiner

Primary Examiner—Douglas A. Wille
(74) Attorney, Agent, or Firm—Sughrue Mion, PLLC (57) ABSTRACT

A fabrication method for a MEMS structure, the MEMS structure including a fixing portion fixed to the substrate and a floating portion floating above the substrate. A sacrificial layer deposited on the substrate is patterned to have a groove forming a space surrounding the area corresponding to the area in which the fixing portion is to be formed. If the MEMS structure is deposited on the sacrificial layer, a sidewall is formed inside the space and the fixing portion and the floating portion are formed on the sacrificial layer. If the sacrificial layer is removed using an etchant, the sacrificial layer at the bottom of the fixing portion is protected from the etchant by the sidewall and accordingly, the sacrificial layer except the area surrounded by the sidewall is removed. Therefore, only the sacrificial layer under the floating portion is removed. Because the connecting portion is fabricated to have the same thickness as the fixing portion and the floating portion, a strong/durable MEMS structure is provided. Additionally, the boundary between the fixing portion and the floating portion can be precisely determined, and adjustment of the length of the floating portion can be precisely controlled.

10 Claims, 8 Drawing Sheets

MEMS STRUCTURE HAVING A BLOCKED-SACRIFICIAL LAYER SUPPORT/ANCHOR AND A FABRICATION METHOD OF THE SAME

BACKGROUND OF THE INVENTION

1. Field of the Invention

The present invention relates to a MEMS (Microelectromechanical Systems) structure and a fabrication method of the same, and more particularly, to a MEMS structure having a floating portion above a substrate and a fabrication method of the same.

2. Description of the Related Art

MEMS is a technology for realizing mechanical and electronic devices using a semiconductor manufacturing process. An element manufactured using MEMS technology generally has a bendable portion floating above a substrate for mechanical operation.

Figure 1:
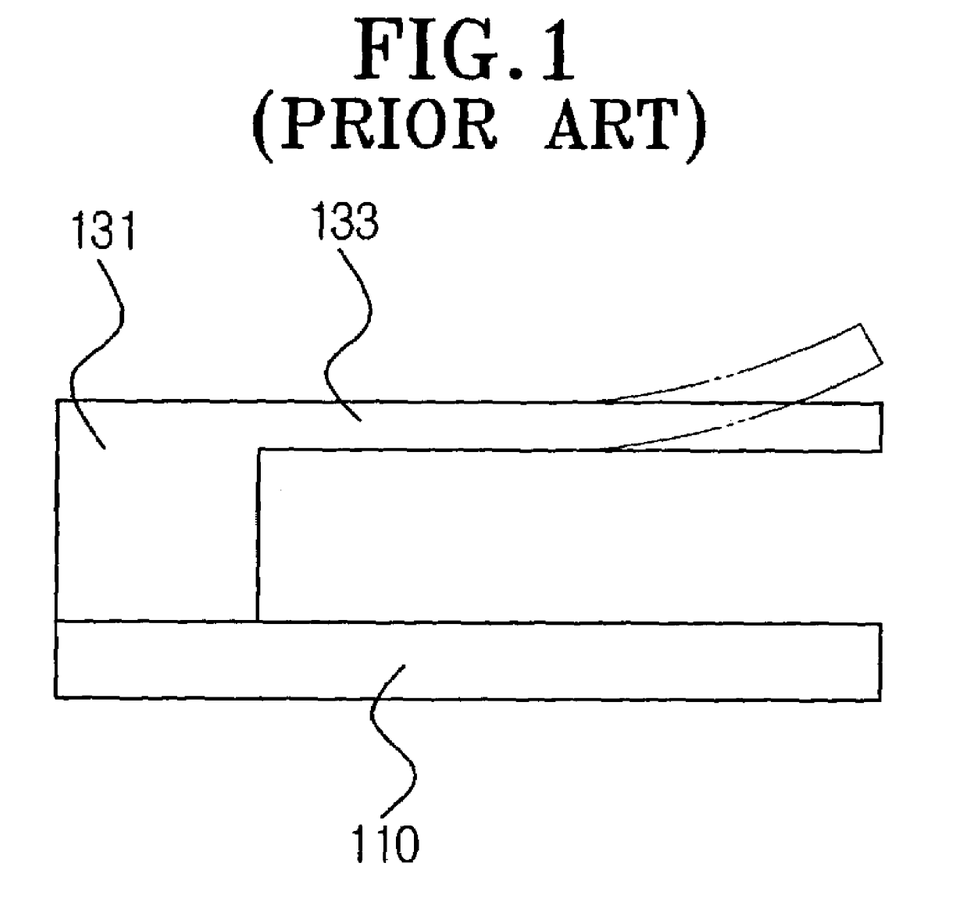
FIG. 1 is a schematic side section view of a MEMS structure.

FIG. 1 is a drawing showing an example of a MEMS structure.

The MEMS structure has a substrate (110), a fixing portion (131) fixed on the substrate (110) and a floating portion (133) extended from the fixing unit (131). The fixing unit (131) is commonly referred to as an anchor or a support and has a function of fixing the floating portion (133) to the substrate (110). The floating portion (133) floats above the substrate (110) thereby bending upward and downward by an external driving force as shown by the two-dotted line. The floating portion (133) can be formed as a beam or membrane if necessary.

FIGS. 2A through 2D are drawings illustrating consecutive examples of the manufacturing process of the MEMS structure.

Figure 2A:
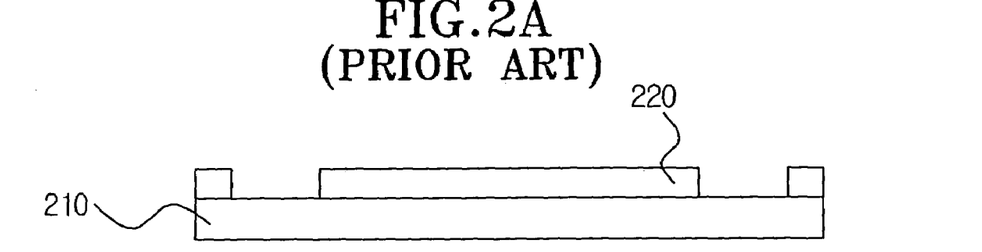
FIGS. 2A through 2D are drawings illustrating an example of a conventional MEMS structure fabrication.
Figure 2B:
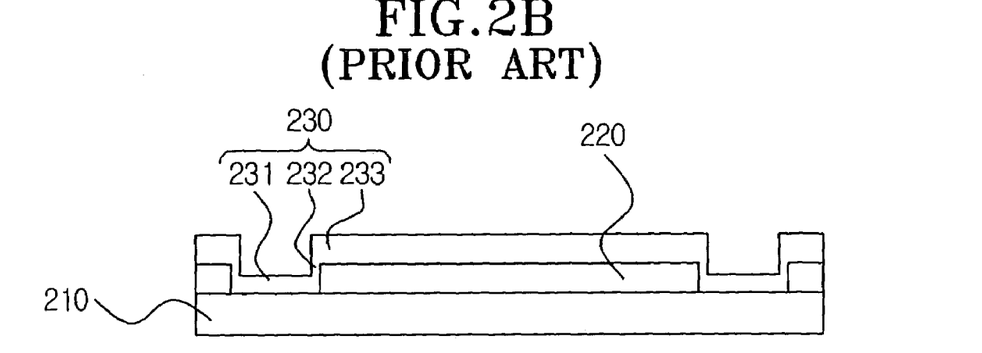

On the substrate (210), a sacrificial layer (220) is deposited and the sacrificial layer (220) is patterned to have a form of an anchor fixed on the substrate (210) as shown in FIG. 2A. On the patterned sacrificial layer, (220) a MEMS structure layer (230) is deposited as shown in FIG. 2B. As the MEMS structure layer (230) is deposited, a floating portion (233) is formed on the part where the sacrificial layer (220) remains, while a fixing portion (231) and a connecting portion (232), which connects the fixing portion (231) and the floating portion (233), are formed on the part where the sacrificial layer (220) is removed.

Figure 2C:
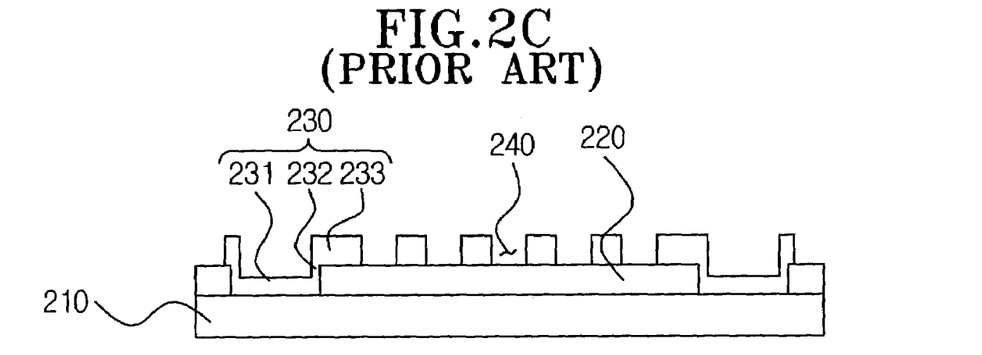
Figure 2D:
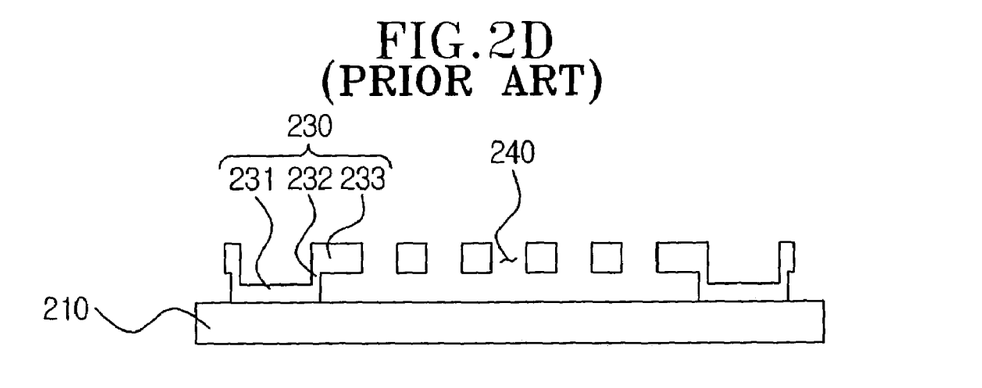

Next, etchant access holes (240) are formed on the floating portion (233) of the MEMS structure layer (230) as shown in FIG. 2C. When etchant is applied to the sacrificial layer (220) through the etchant access holes (240), the sacrificial layer (220) is removed and the floating portion (233) becomes separated from the substrate (210) as shown in FIG. 2D.

Depositing the MEMS structure layer (230) on a patterned sacrificial layer (220) and then removing the sacrificial layer (220) is the most generally used method for fabricating a MEMS structure that floats above the substrate (210).

However, the MEMS structure fabricated by this method is problematic since the connecting portion (232), which connects the fixing portion (231) fixed on the substrate (210) and the floating portion (233) disposed above the substrate (210), is relatively thinner than the other parts and therefore very weak. As a result, the connecting portion (232) can be damaged as the movement of the floating portion (233) is repeated. Furthermore, it becomes difficult to have a sophisticated control over the movement range of the floating portion (233) since the connection condition of the connecting portion (232) varies.

FIGS. 3A through 3D are drawings illustrating consecutive examples of the MEMS structure fabrication process using a SOI (Silicon on Insulator) wafer.

Figure 3A:
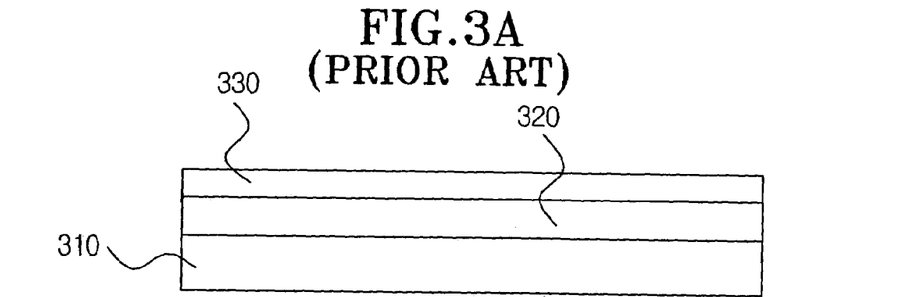
FIGS. 3A through 3D are drawings illustrating another example of a conventional MEMS structure fabrication.
Figure 3B:
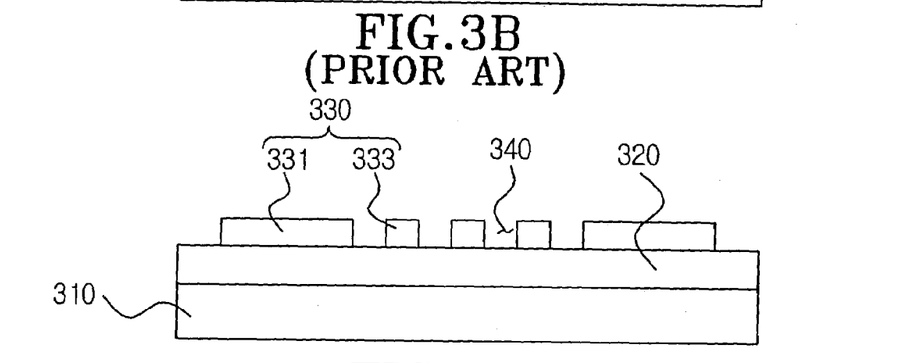

As shown in FIG. 3A, a sacrificial layer (320) is deposited on a substrate (310). On top of the sacrificial layer (320), a MEMS structure layer (330) for forming the MEMS structure is deposited. The MEMS structure layer (330) is patterned to have a form of the MEMS structure to be fabricated. When the MEMS structure layer (330) is patterned as shown in FIG. 3B, etchant access holes (340) are also formed. The etchant access holes are formed on a part of the floating portion (333) of the MEMS structure layer (330) but not of the fixing portion (331).

Figure 3C:
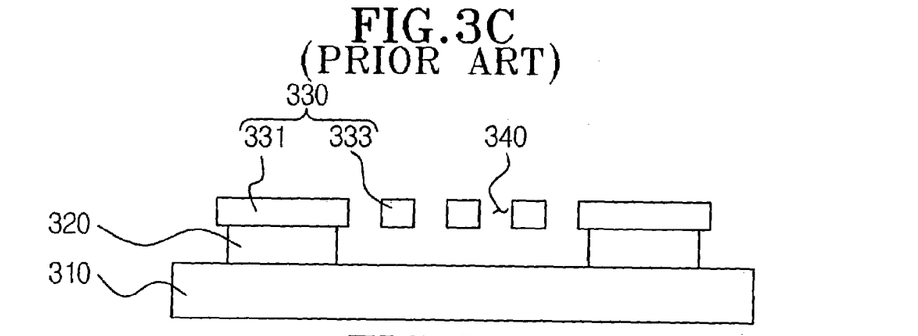

And then, when etchant is applied to the sacrificial layer (320) through the etchant access holes (340), the sacrificial layer (320) is partially removed. At this time, because the etchant access holes (340) are formed only on the part of the floating portion (333), the sacrificial layer (320) under the floating portion (333) is totally removed, and the sacrificial layer (320) under the fixing portion (331) is partially removed along the edges as shown in FIG. 3C.

As the floating MEMS structure is fabricated on the substrate (310) by depositing the MEMS structure layer (330) on the sacrificial layer (320) and etching a part of the sacrificial layer (320), the part of the sacrificial layer (320) that is not removed functions as an anchor fixing the MEMS structure onto the substrate (310).

Figure 3D:
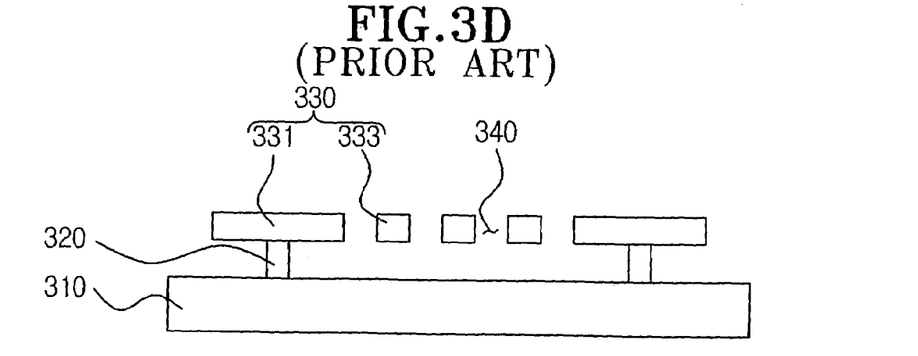

However, according to this method, precise control of the floating portion's (333) length is difficult because the width of the sacrificial layer (320) that functions as an anchor varies depending on the amount of time the sacrificial layer (320) is exposed to the etchant. That is, if the sacrificial layer's (320) exposure time to the etchant is long, the width of the anchor becomes narrow as shown in FIG. 3D. Conversely, if the exposure time is short, the width becomes wide as shown in FIG. 3C. Accordingly, the length of the floating portion (333) varies. Therefore, this method is not suitable for fabricating a MEMS structure requiring a precise size and length of the floating portion (333).

Additionally, since a MEMS structure fabricated by this method has the sacrificial layer (320) between the fixing portion (331) and the substrate (310), if the sacrificial layer (320) uses an insulating material, it is difficult to electrically connect to other circuits on the substrate (310). Consequently, additional effort is required to connect the MEMS structure to other circuits.

SUMMARY OF THE INVENTION

In order to solve the above problems, the present invention has been developed to provide a MEMS structure and associated fabrication method wherein the fixing portion fixed to the substrate and the floating portion floating above the substrate are strongly connected, adjustment of the length of the floating portion can be precisely controlled, and electrical connection to other circuits is easy.

According to the present invention, the method of fabricating the MEMS structure having a fixing portion fixed to the substrate and a floating portion connected to the fixing portion and disposed above the substrate, includes the steps of depositing a sacrificial layer on the substrate, patterning the sacrificial layer and forming a space surrounding at least a part of the area corresponding to the area on which the fixing portion is to be formed, depositing a MEMS structure layer on the sacrificial layer and forming a sidewall inside the space and the fixing portion and the floating portion on the sacrificial layer, and removing the sacrificial layer using an etchant. In the removing step, the application of the etchant to a part of the sacrificial layer corresponding to the fixing portion is blocked by the sidewall, and the sacrificial layer except a part surrounded by the sidewall is removed.

According to the present invention, a strong/durable MEMS structure is provided with a connecting portion having the same thickness as both the fixing portion and the floating portion. Additionally, since the fixing portion and the substrate are connected by the sidewall, an electrical contact between the MEMS structure and other circuits can be easily made.

Preferably, in the space forming step, the space is substantially formed across the entire area except the area corresponding to the connecting portion, which connects the fixing portion and the floating portion, and the width of the connecting portion is formed narrower than that of the fixing portion. Accordingly, the boundary between the fixing portion and the floating portion can be clearly determined and adjustment of the length of the floating portion can be precisely controlled. Additionally, when removing the sacrificial layer using the etchant, a precise set up of an exposure time is not necessary.

Thus, a MEMS structure according to the present invention includes a substrate, a fixing portion fixed to the substrate, a floating portion above the substrate, an anchor interposed between the fixing portion and the substrate and fixing the fixing portion to the substrate, and a sidewall surrounding at least a part of the side of the anchor.

BRIEF DESCRIPTION OF THE DRAWINGS

The aforementioned features and characteristics of the present invention will be more apparent from the following description of an illustrative, non-limiting embodiment of the present invention with reference to the accompanying drawings, in which.

DETAILED DESCRIPTION OF THE PRESENT INVENTION

Hereinafter, an illustrative, non-limiting embodiment of the present invention will be described in greater detail with reference to the accompanying drawings.

Figure 4A:
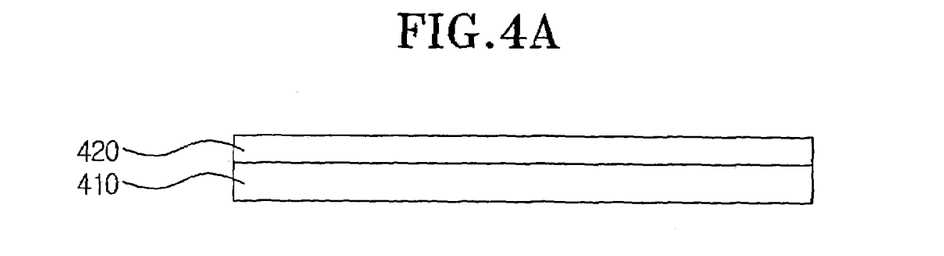
FIGS. 4A through 4F are drawings illustrating the MEMS structure fabrication process according to the present invention.

FIGS. 4A through 4F are drawings illustrating the MEMS structure fabrication process according to the present invention, and FIGS. 5A through 5E are the perspective views showing the process of the MEMS structure fabrication according to the fabrication process shown in FIGS. 4A though 4F.

Figure 4B:
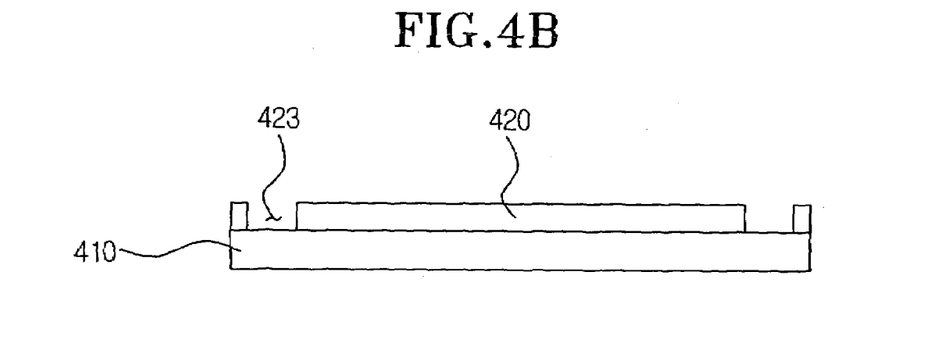
Figure 5A:
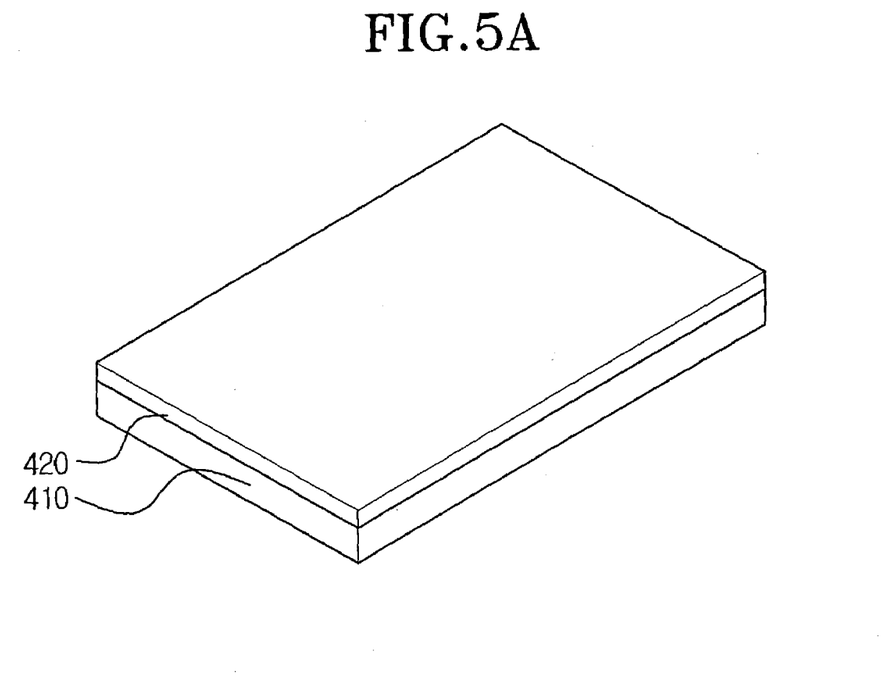
FIGS. 5A through 5E are perspective views showing the process of the MEMS structure fabrication according to the fabrication process shown in FIGS. 4A though 4F.
Figure 5B:
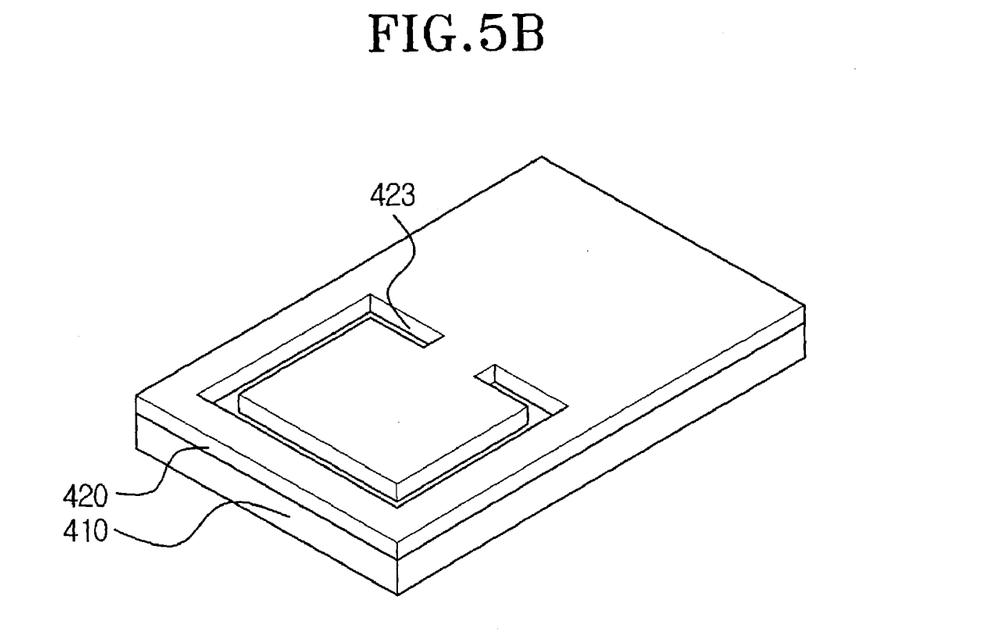

As shown in FIG. 4A and FIG. 5A, a sacrificial layer (420) is deposited onto the substrate (410), which was fabricated using a semiconductor material such as silicon. The sacrificial layer (420) can be manufactured using materials like Al, Cu, Oxide or Ni. As shown in FIG. 4B and FIG. 5B, the sacrificial layer (420) is patterned to have a predetermined form. A part of the sacrificial layer (420) is removed by the patterning, to form a groove forming a space (423) on the sacrificial layer (420). The space (423) having a form of a groove corresponds to the form of the anchor profile, as described below.

Figure 4C:
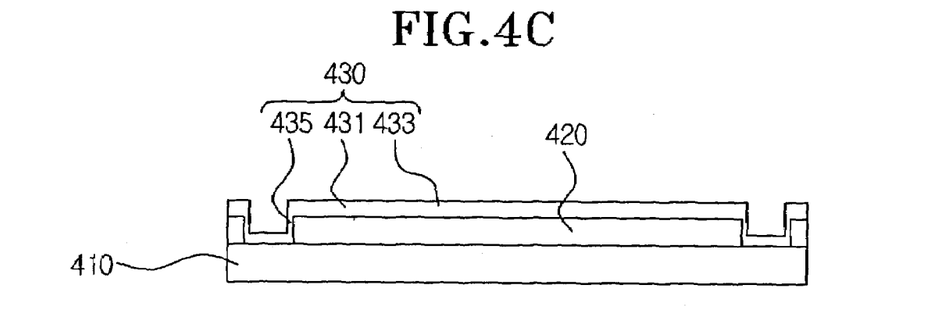
Figure 5C:
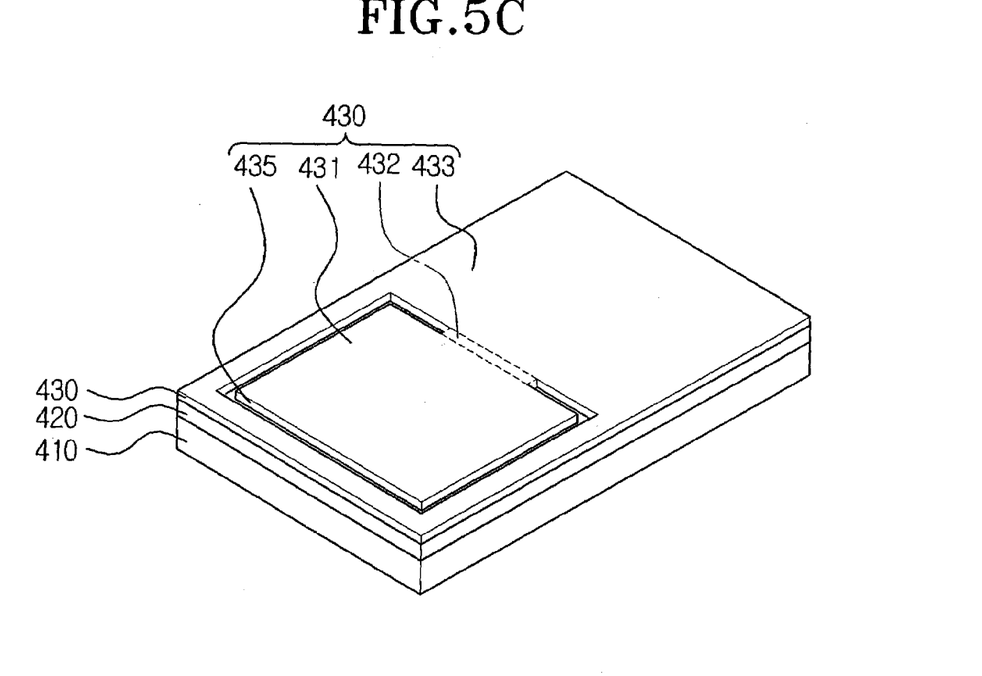

On the patterned sacrificial layer (420), the MEMS structure layer (430) is deposited as shown in FIG. 4C and FIG. 5C. The MEMS structure layer (430) is formed, for example, by the vapor deposition of materials such as Au. The MEMS structure layer (430) is also deposited inside a space (423) formed on the sacrificial layer (420). Accordingly, the MEMS structure layer (430) comprises a fixing portion (431) fixed on the sacrificial layer (420), a floating portion (433) disposed above the substrate (410) when the sacrificial layer (420) is later removed, and a sidewall (435) formed inside the space (423). The MEMS structure layer (430) has an even thickness across the sacrificial layer (420), but the horizontal thickness of the sidewall (435) is thinner than the other parts of the MEMS structure (430) as the MEMS structure layer (430) is vertically deposited onto the substrate (430).

Figure 4D:
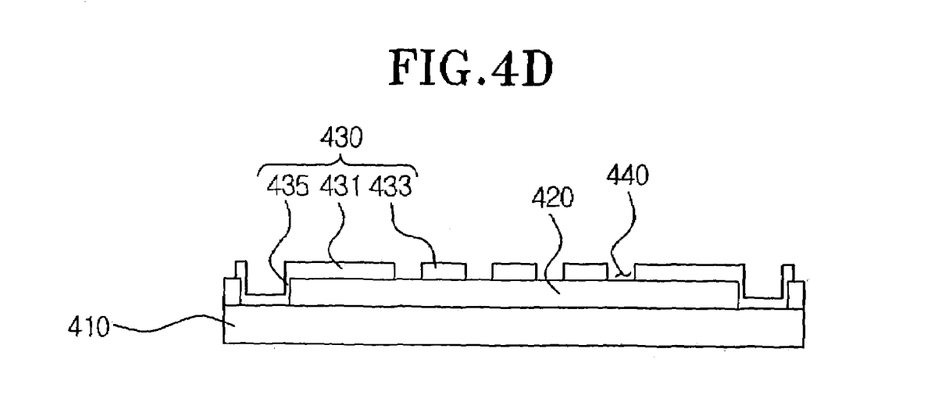
Figure 5D:
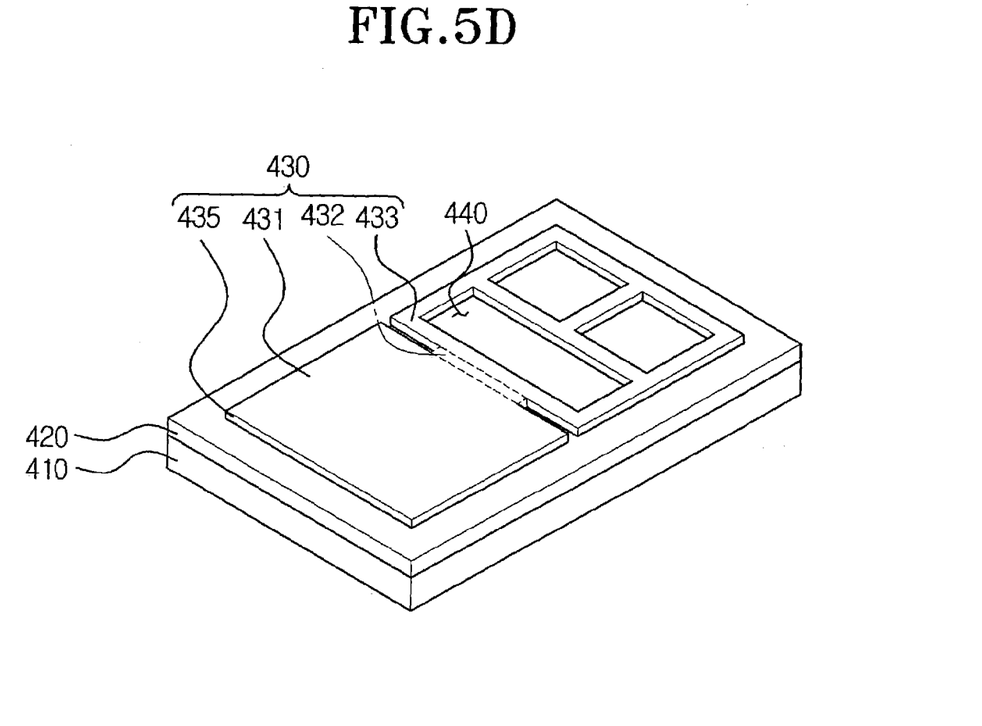

As shown in FIG. 4D and FIG. 5D, etchant access holes (440) are formed on the MEMS structure layer (430). In this process, the etchant access holes (440) are formed on the part later becoming the floating portion (433), such as a beam or membrane, of the MEMS structure layer, but not formed on the part later becoming the fixing portion (431).

Figure 4E:
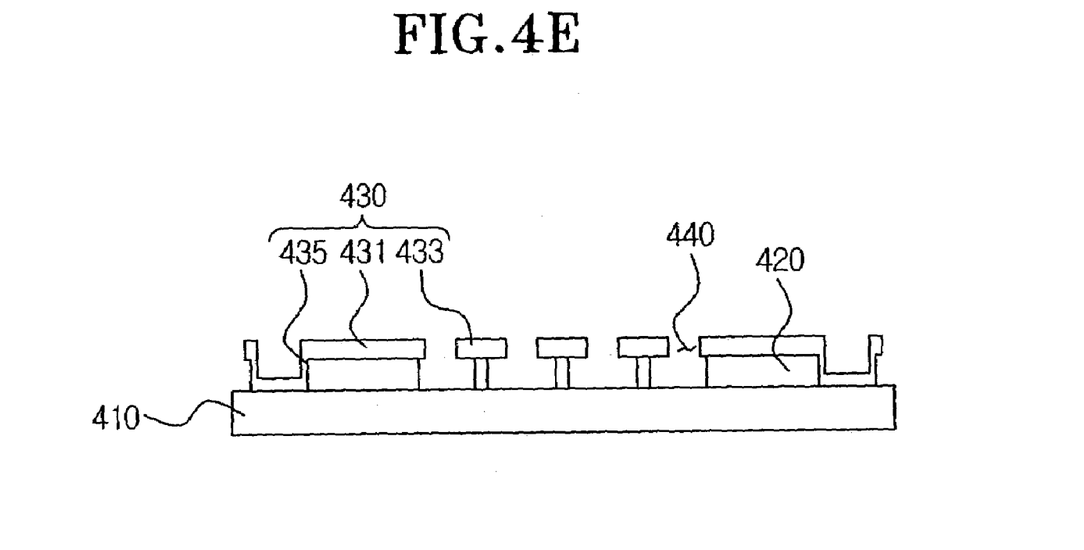
Figure 4F:
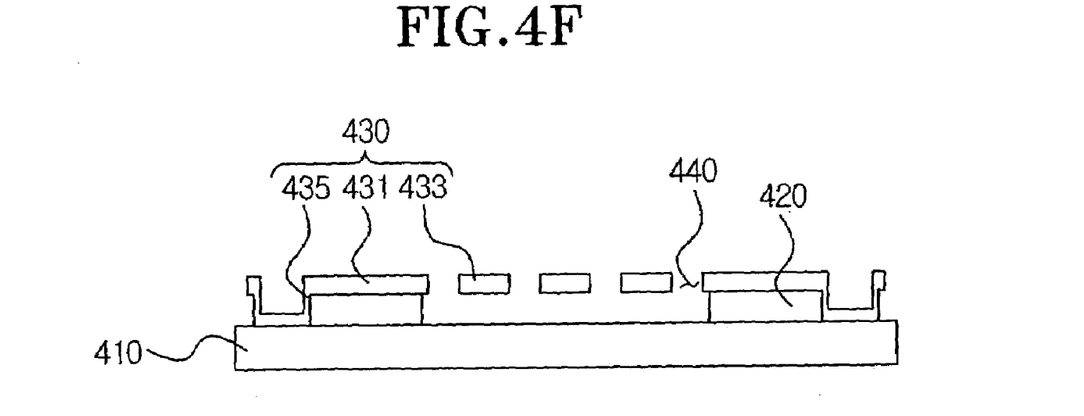

When the etchant selectively etching the sacrificial layer (420) only is applied through the etchant access holes (440), a part of the sacrificial layer is etched and removed. FIG. 4E and FIG. 4F show the sacrificial layer (420) under the floating portion (433) gradually being removed, as the sacrificial layer (420) is continually exposed to the etchant.

The etchant is applied to the sacrificial layer (420) under the floating portion (433) but not to the sacrificial layer (420) under the fixing portion (431). This is because there are no etchant holes (440) on the fixing portion (431) and also because the sacrificial layer (420) under the fixing portion (431) is surrounded by the sidewall (435). Therefore, the sacrificial layer (420) under the fixing portion (431) is not etched due to the protection of the sidewall (435) and remains unchanged. Accordingly, the sacrificial layer (420) under the fixing portion (431) functions as an anchor by firmly fixing the fixing portion (431) to the substrate (410).

During the sacrificial layer (420) exposure process, the sacrificial layer under the fixing portion (431) is not removed because the sacrificial layer (420) is pre-patterned to form the sidewall (435) when the MEMS structure layer (430) is formed. Since the size of the anchor is decided by the position of the sidewall (435), adjustment of the length of the floating portion (433) is precisely controlled. Although the thickness of the sidewall (435) is formed to be thinner than the other parts of the MEMS structure (430), because the etchant only removes the sacrificial layer (420) and not the sidewall (435), the sacrificial layer (420) under the fixing portion (431) can be sufficiently protected from the etchant by the thin sidewall (435).

Figure 5E:
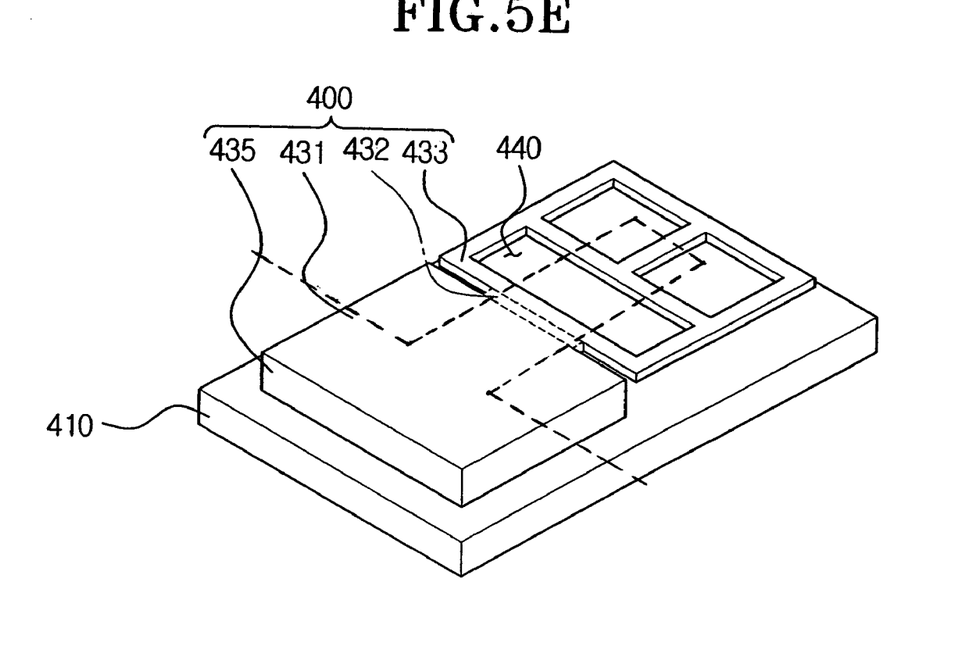

Additionally, as shown in FIGS. 4F and 5E, the MEMS structure formed by the above method has the fixing portion (431), the floating portion (433) and the connecting portion (432), which connects the fixing portion (431) and the floating portion (433), integrated as a whole on the same level during the process of depositing the MEMS structure layer (430). Therefore, the strength of the connecting portion (432) is improved and weakening of the connecting portion (432) is prevented, because the thickness of the connecting portion (432) is the same as that of the fixing portion (431) and the floating portion (433).

Furthermore, according to the above-described MEMS structure, the sidewall (435) formed during the MEMS structure layer (430) depositing process touches the substrate (410). Therefore, the substrate (410) and the fixing portion (431) are connected by the sidewall (435). Accordingly, the electrical connection between the MEMS structure and other circuits formed on the substrate (410) is simplified.

Meanwhile, during the process of patterning the sacrificial layer (420), as shown in FIGS. 4B and 5B, the space (423) formed by the patterning is formed to surround at least a part of the area corresponding to the area in which the fixing portion (431) is to be formed. In other words, the space (423) is formed to substantially surround the area in which the fixing portion (431) is to be formed, excluding the area in which the connecting portion (432) is to be formed. Accordingly, the sidewall (435) is also formed to substantially surround the area of the fixing portion (431) except for the area in which the connecting portion (432) is formed. Therefore, almost all of the sacrificial layer (420) that is to be an anchor is effectively blocked from the etchant's contact by the sidewall (435).

Figure 6:
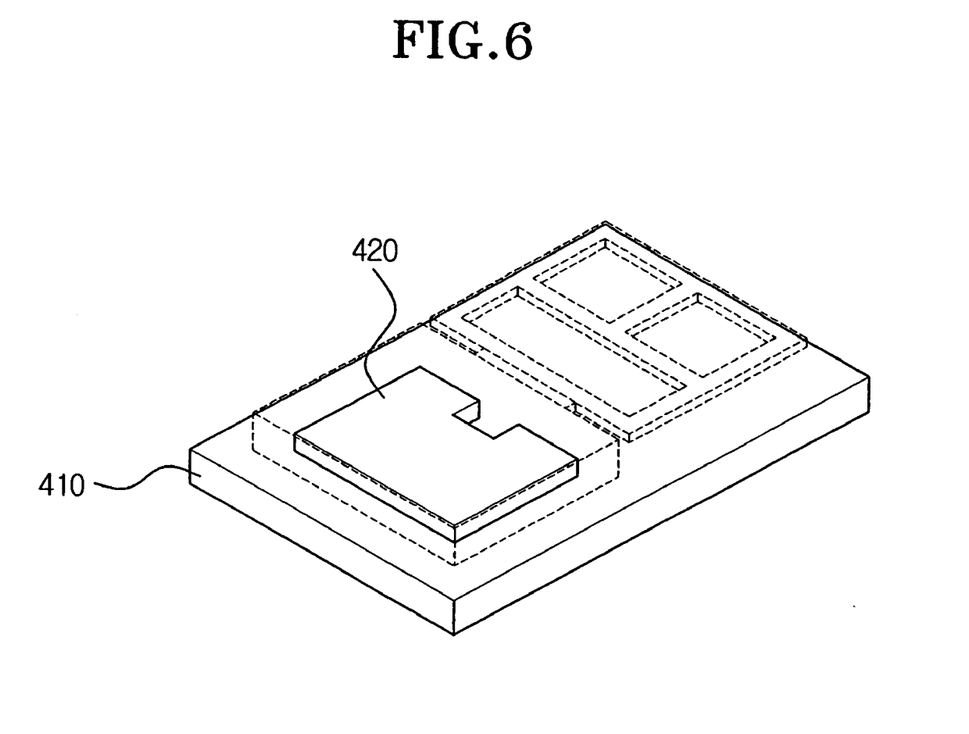
FIG. 6 is a drawing showing the form of a sacrificial layer inside the MEMS structure of FIG. 5E.

FIG. 6 is a drawing showing the form of the sacrificial layer inside the MEMS structure of FIG. 5E. Because no sidewall (435) is formed below the connecting portion (432), during the sacrificial layer (420) removal process, part of the sacrificial layer (420) may be removed by the etchant flowing in below the connecting portion (432), as shown in FIGS. 4F and 6.

However, even when part of the sacrificial layer (420) is removed, as shown in FIG. 6, only the parts around the connecting portion (432) are removed, because the width of the connecting portion (432) is formed to be narrower than that of the fixing portion (431). Therefore, the length of the floating portion (433) does not vary substantially because although part of the sacrificial layer (420) below the fixing portion (431) is removed, the condition of the fixing portion (431) being fixed by the anchor does not change substantially. Accordingly, the length of the floating portion (433) can be precisely adjusted as desired.

According to the present invention as described above, since the connecting portion is fabricated to have the same thickness as the fixing portion and the floating portion, a strong/durable MEMS structure is provided. Additionally, because an anchor is formed by the sacrificial layer protected from etching by the sidewall, a boundary between the fixing portion and the floating portion can be precisely determined. Therefore, adjustment of the length of the floating portion can be precisely controlled. Furthermore, since the fixing portion and the substrate are connected by the sidewall, an electrical connection between the MEMS structure and other circuits is simplified.

Also, according to the present invention, a precise set up of an exposure time for the process of removing the sacrificial layer using the etchant is not necessary because the to-be anchor part is protected from the etchant by the sidewall. Therefore, it is possible to have a sufficiently long exposure time, as required for the complete removal of the sacrificial layer under the floating portion, because even though part of the sacrificial layer, which is later to be an anchor, is removed, no influence will be made to the performance of the MEMS structure since the width of the connecting portion is narrower than that of the fixing portion.

Although illustrative, non-limiting embodiments of the present invention have been described, it will be understood by those skilled in the art that the present invention should not be limited to the described embodiments. Various changes and modifications can be made without departing from the sprit and scope of the present invention as defined by the appended claims.

What is claimed is:

1. A MEMS structure comprising:
 a substrate;
 a fixing portion disposed above the substrate;
 a sacrificial layer portion supporting the fixing portion and interposed between the fixing portion and the substrate;
 a floating portion directly connected with the fixing portion and floating above the substrate; and
 a sidewall surrounding at least part of one or more sides of the sacrificial layer portion;
 wherein the sacrificial layer portion is interposed between substantially the entire fixing portion and the substrate.

2. The MEMS structure of claim 1, wherein the sidewall is formed to substantially surround an area of the fixing portion, except a part of the area corresponding to the connecting portion connecting the fixing portion and the floating portion.

3. The MEMS structure of claim 2, wherein the width of the connecting portion is narrower than the width of the fixing portion.

4. The MEMS structure of claim 1, wherein the sidewall, the fixing portion and the floating portion are formed as a whole.

5. The MEMS structure of claim 1, wherein the sidewall is in direct contact with the substrate.

6. The MEMS structure according to claim 1, wherein a connecting portion, connecting said fixing portion to said floating portion, corresponds in thickness to said floating portion.

7. The MEMS structure of claim 1, wherein said sidewall is formed of a different material than said sacrificial layer portion.

8. The MEMS structure of claim 7, wherein said sacrificial layer portion is formed of a different material than said fixing portion.

9. The MEMS structure of claim 1, wherein said floating portion is lifted above said substrate to a height corresponding with the thickness of said sacrificial layer portion.

10. A MEMS structure comprising:
 a substrate;
 a MEMS structure layer;
 a sacrificial layer portion;
 wherein a first portion of said MEMS structure layer is in contact with said substrate and surrounds at least part of each side of said sacrificial layer portion, a second portion of said MEMS structure layer is supported by said sacrificial layer portion, said sacrificial layer portion being interposed between substantially the entirety of said second portion of said MEMS structure layer and said substrate, and a third portion of said MEMS structure layer is directly connected to said second portion of said MEMS structure layer and floats above said substrate.

* * * * *